United States Patent [19]

Ingle

[11] 4,095,125

[45] June 13, 1978

[54] PULSE SIGNAL DETECTOR AND/OR FILTER

[75] Inventor: Edwin Coy Ingle, Julian, N.C.

[73] Assignee: Bell Telephone Laboratories, Incorporated, Murray Hill, N.J.

[21] Appl. No.: 773,006

[22] Filed: Feb. 28, 1977

[51] Int. Cl.² ............................................. H03K 9/08
[52] U.S. Cl. .................................. 307/234; 307/311; 328/112
[58] Field of Search .............. 307/234, 311; 328/111, 328/112, 109, 110

[56] References Cited

U.S. PATENT DOCUMENTS

| | | | |
|---|---|---|---|
| 2,984,789 | 5/1961 | O'Brien | 307/234 X |
| 3,315,168 | 4/1967 | Cantella | 328/112 |
| 3,676,699 | 7/1972 | Warren | 328/112 X |
| 3,735,271 | 5/1973 | Leibowitz | 328/112 |
| 3,821,563 | 6/1974 | Warren | 307/234 |
| 3,852,731 | 12/1974 | Hollands | 328/111 X |
| 3,970,944 | 7/1976 | Huellwegen | 307/234 X |

Primary Examiner—John S. Heyman
Attorney, Agent, or Firm—Thomas Stafford

[57] ABSTRACT

Pulse signals are detected and/or filtered depending on pulse width. A first timing circuit is employed to establish first minimum interval T1 and a second timing circuit responsive to the first timing circuit timing out is employed to establish second timing interval T2. A third maximum interval T3 is defined as T1 + T2. Pulse signals having widths within a valid time interval window greater than minimum interval T1 and less than maximum interval T3 are detected and filtered. Pulse signals having widths less than interval T1 are not detected and are filtered. Pulse signals having widths greater than interval T3 are not detected or filtered. Pulse signals within the valid time interval window are detected by employing light emitting diodes to sense operative states of the timing circuits.

18 Claims, 4 Drawing Figures (A) WINK TIME WINDOW
(B) OI1, OI2
(C) OI3
(D) OI4, OI5
(E) WINK OUTPUT
(F) OI1, OI2
(G) OI3
(H) OI4, OI5
(I) WINK OUTPUT

PULSE SIGNAL DETECTOR AND/OR FILTER

BACKGROUND OF THE INVENTION

This invention relates to pulse discriminators and, more particularly, to a pulse detector and/or filter capable of detecting pulses having widths greater than a first predetermined interval and less than a second predetermined interval while filtering pulse signals having widths less than the second predetermined interval.

There are numerous applications in which it is desirable to detect and/or filter pulse signals depending on a prescribed characteristic of the pulse, for example, pulse width. It has been desirable to detect pulse signals which have pulse widths greater than a first predetermined interval but less than a second predetermined interval. In specific applications it is also desirable not to detect but to filter pulse signals which have widths less than the first predetermined interval and to detect and filter pulse signals which fall within the time interval window between the first and second predetermined intervals, while passing undetected those signals which have widths greater than the second predetermined interval.

Such detectors and filters have found use in telephone supervisory and signaling systems. In particular, they have been employed in so-called "wink" signaling systems. A wink signal is a momentary change in the supervisory condition present on a telephone wire signaling lead that is present for more than a first predetermined interval but less than a second predetermined interval. That is to say, a valid wink signal is a pulse signal having a pulse width that falls within a prescribed time interval window. These wink signals are employed in various telephone systems for different purposes. For example, in one system a wink signal is employed to alert the switching system that multifrequency tone signals are to follow so that proper equipment may be made operative or otherwise attached to the incoming transmission path in order to receive the multifrequency tones. However, since wink signals are employed for other purposes in other systems and equipments, it is also necessary that the wink signal not be propagated beyond the detection equipment in a particular office. Thus, the need for filtering wink signals. It is also important that other signals on the signaling lead be propagated without being filtered, for example, on-hook and off-hook supervisory signals.

Prior arrangements which have been employed to achieve the desired functions used complex time subtraction and/or complex time delay circuits. One prior arrangement employs a plurality of monostable multivibrators and logic gates to realize a pulse width filtering function which allows only pulses within a prescribed time window to pass. These prior circuits, although found to be satisfactory in some applications, are unsatisfactory in others because of their complexity, cost and/or space usage.

SUMMARY OF THE INVENTION

These and other problems are resolved in accordance with the inventive principles described herein in a pulse width detector and/or filter.

In one embodiment of the invention a first controllable timing circuit is employed to establish first predetermined minimum time interval T1 and a second controllable timing circuit is employed to establish second predetermined time interval T2, wherein the sum of intervals T1 and T2 establish third maximum predetermined interval T3. The first timing circuit is controllably enabled by an applied input signal while the second timing circuit is controllably enabled or not by an output from the first timing circuit. Sensing elements are employed to detect the operative condition of the input to the first timing circuit, of the operative state of the second timing circuit, and of the state of the output of the second timing circuit. Outputs from the sensing elements are employed to yield an indication whether an applied pulse signal is present for a duration greater than the minimum time interval T1 and less than the maximum time interval T3. That is to say, whether the applied signal has a width within a valid time interval window. Signals of duration less than interval T3 are not propagated beyond the detector and, therefore, are effectively filtered, while signals present for less than interval T1 are not detected but are filtered. Signals present for greater than interval T3 are not detected and are propagated beyond the detector circuit.

In one particular embodiment of the invention the sensing elements are unidirectional radiant energy emitting elements, for example, light emitting diodes (LEDs), which are employed with associated radiant energy responsive elements, for example, phototransistors, to yield an indication when the applied pulse signal has a width which falls within the valid time interval window. The LEDs and phototransistors are spatially related on a one-to-one basis and form what are now commonly referred to as optical couplers or optical isolators.

BRIEF DESCRIPTION OF THE DRAWINGS

These and other objects and advantages of the invention will be more fully understood from the following detailed description of embodiments of the invention taken in accordance with the appended drawings in which.

DETAILED DESCRIPTION

Figure 1:
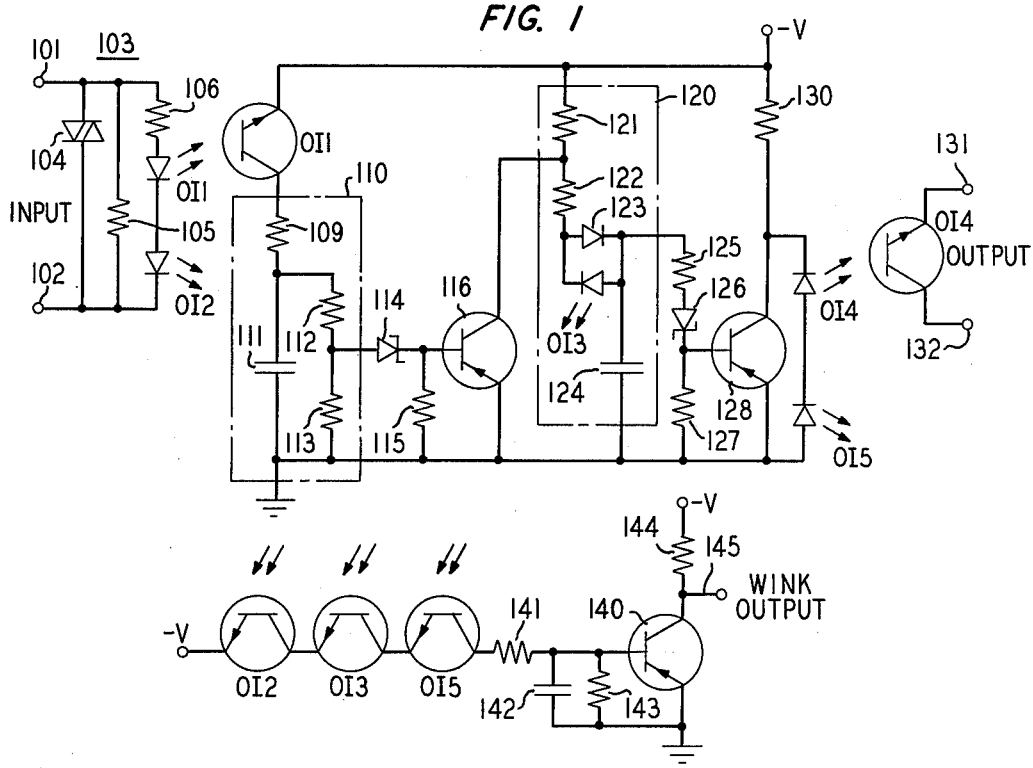
FIG. 1 shows details of one embodiment of the invention employed to detect and filter on-hook wink signals.

FIG. 1 shows details of one embodiment of a pulse detector and filter employing the instant invention. Accordingly, signals are supplied via input terminals 101 and 102 to input circuit 103. The signals may be, for example, those employed in telephone signaling and/or supervision. The particular signals may include off-hook, on-hook and wink supervisory signals. A wink signal is a momentary interruption in a particular one of the supervisory signals, for example, either on-hook or off-hook, and may be characterized as being a pulse signal having a pulse width greater than a first predetermined interval, T1, and less than another predetermined interval, $T3 = T1 + T2$, where T2 represents a valid time interval window.

Input circuit 103 includes variolosser 104, resistor 105, and a series connection of limiting resistor 106 and light emitting diodes (LEDs) OI1 and OI2. LED OI2 is employed to yield radiant energy, i.e., light, or not, representative of the presence or absence, respectively, of an applied input signal. The radiant energy from LED OI2 is supplied to an associated radiant energy responsive element, for example, phototransistor OI2. LED OI1 is employed to couple the applied input signal to an associated radiant energy responsive element, for example, phototransistor OI1. In turn, phototransistor OI1 responds to the radiant energy, i.e., light, from LED OI1 to connect controllably potential source $-V$ via resistor 109 to first timing circuit 110. When LED OI1 is off, phototransistor OI1 is also off and source $-V$ is controllably disconnected from timer 110.

First timing circuit 110 includes resistor 109, capacitor 111, resistor 112 and resistor 113. The charging time constant of capacitor 111 and, hence, first timing circuit 110, is primarily determined by the component values of resistor 109 and capacitor 111. The discharging time constant of timing circuit 110 is primarily determined by the component value of capacitor 111, resistor 112 and resistor 113. The affect of Zener diode 114, resistor 115 and the base-to-emitter junction of transistor 116 on the discharge time constant of first timing circuit 110 is substantially negligible and may be ignored in this example. In one example from experimental practice, the charging time constant of timing circuit 110 is selected to be approximately 10 milliseconds (ms) while the discharging time constant is selected to be approximately 50 ms. It will be apparent to those skilled in the art how to adjust the time constant to any number of desired values.

Zener diode 114 is employed to set a threshold potential for controlling the conductive state of transistor 116. Consequently, when the negative potential developed at the junction of resistors 112 and 113 caused by capacitor 111 charging exceeds the threshold value established by Zener diode 114 and the base-to-emitter junction of transistor 116, Zener diode 114 breaks down, i.e., conducts, thereby turning transistor 116 on. Similarly, when the potential developed at the junction between resistors 112 and 113 drops below the threshold value because of capacitor 111 discharging, Zener diode 114 ceases to conduct and transistor 116 is turned off. Thus, transistor 116 responds to a potential developed by timing circuit 110 to switch on and off.

Transistor 116 is employed, in turn, to control the operative states of second timing circuit 120. That is to say, transistor 116 controls whether timing circuit 120 is charging or discharging. Specifically, when transistor 116 is off, timing circuit 120 is charging and when transistor 116 is on, timing circuit 120 is discharging. Timing circuit 120 includes resistor 121, resistor 122, diode 123, LED OI3 and capacitor 124. LED OI3 is employed to yield radiant energy, i.e., light, or not, representative of the charging state or discharging state, respectively, of second timing circuit 120. The light output from LED IO3 is coupled to an associated radiant energy responsive element, for example, phototransistor OI3. The charging time constant of timing circuit 120 is primarily determined by resistor 121, resistor 122, voltage drop across LED IO3 and capacitor 124. The discharge time constant of timing circuit 120 is primarily determined by the component values of resistor 122, voltage drop across diode 123 and capacitor 124. Here again, the affect of resistor 125, Zener diode 126, resistor 127 and the base-to-emitter junction of transistor 128 on the discharging time constant is substantially negligible and may be ignored. The charging time constant of second timing circuit 120 is selected so that a threshold potential determined by Zener diode 126 and by base-to-emitter junction of transistor 128 is attained approximately in a predetermined time interval, namely, second interval T2. In one example, interval T2 is selected to be approximately 100 ms. The discharge time constant of timer 120 is selected to be much less than the charging time constant so that capacitor 124 is discharged fairly rapidly upon transistor 116 being turned on. This is important so that the input pulse state supplied to terminals 101 and 102, other than the transient pulse condition to be detected, i.e., wink signals, is rapidly communicated to the output terminals, as will be explained below.

As indicated above, Zener diode 126 sets a threshold potential for controlling the operative states of transistor 128. Thus, when a potential developed across capacitor 124 exceeds this threshold potential, Zener diode 126 conducts, thereby turning transistor 128 on. Similarly, when a potential developed across capacitor 124 drops below the selected threshold level, transistor 128 is turned off. In turn, transistor 128 controls the operative states of radiant energy emitting elements, for example, LED OI4 and LED OI5. Specifically, when transistor 128 is on the potential from source $-V$ is supplied via resistor 130 to a reference potential, i.e., ground potential and, consequently, is shunted away from LEDs OI4 and OI5 thereby turning them off. Conversely, when transistor 128 is off the potential from source $-V$ is supplied via resistor 130 and LEDs OI4 and OI5 to ground potential, thereby causing LEDs OI4 and OI5 to emit radiant energy, i.e., light. LED OI4 supplies its light output to an associated radiant energy responsive element, for example, phototransistor OI4. In turn, phototransistor OI4 is coupled to output terminals 131 and 132. Terminals 131 and 132 may be coupled to utilization means as desired. LED OI5 supplies its light output to an associated radiant energy responsive element, for example, phototransistor OI5. LED OI5 is employed to yield a representation of the output state of the detector circuit. For example, when LED OI5 remains on and continues emitting radiant energy a predetermined interval after application of an input signal, it is an indication that the original input condition subsists, for example, an off-hook supervisory signal. If LED OI5 is off a predetermined interval after application of an input signal, it is an indication that the prior input condition has changed and a new condition now exists, for example, a change from off-hook to on-hook.

Phototransistors OI2, OI3 and OI5 are employed in conjunction with the associated LEDs OI2, OI3 and OI5, respectively, and transistor 140, to generate an output signal indicative of whether or not the applied pulse signal has a width which falls within a prescribed time window, namely, a width greater than interval T1 but less than interval T3. In this example, phototransistors OI2, OI3 and OI5 are connected in series, i.e., AND'ed, with resistor 141 between source $-V$ and the base terminal of transistor 140. Resistor 142 and capacitor 143 are employed for biasing and noise filtering in a manner well known in the art. Potential source $-V$ is connected via resistor 144 to the collector terminal of transistor 140 while the emitter terminal of transistor 140 is connected to a reference potential point, i.e., ground potential. A so-called wink output terminal 145 is also connected to the collector terminal of transistor 140. Since phototransistors OI2, OI3 and OI5 are AND'ed together, associated LEDs OI2, OI3 and OI5 must be on simultaneously to yield a wink output indication by momentarily turning transistor 140 on.

Figure 2:
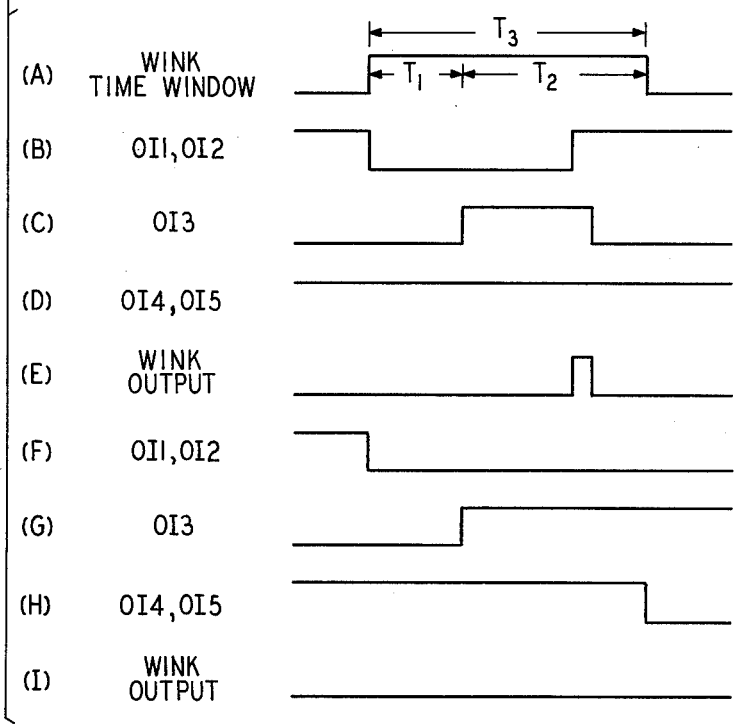
FIG. 2 depicts a sequence of waveforms useful in describing the operation of the circuit of FIG. 1.

The circuit shown in FIG. 1 is best employed to detect and filter on-hook wink signals. Such a wink signal or pulse is defined in this example as initially having an input supplied to terminals 101 and 102 which is turned off for an interval greater than first predetermined interval T1 but less than predetermined interval T3, where T3 = T1 + T2. Interval T2 is designated as the valid wink time window and is illustrated in waveform A of FIG. 2. That is to say, signals having width greater than interval T1 but less than interval T3 are valid wink signals. The operative states of LEDs OI1 and OI2 during a valid wink are shown in waveform B of FIG. 2. That is, LEDs OI1 and OI2 are both initially on then off during the wink and on again after the wink. In response to LED OI1 being initially on, phototransistor OI1 connects source −V to timing circuit 110, charging capacitor 111. In response to LED OI1 being turned off, phototransistor OI1 turns off and timer 110 discharges. Since, in this example, the wink signal is present for greater than interval T1, capacitor 111 discharges causing the potential at the junction of resistors 112 and 113 to drop below the threshold established by Zener diode 114 and transistor 116 is turned off. In turn, timing circuit 120 is enabled and capacitor 124 is being charged, thereby turning LED OI3 on as shown in waveform C of FIG. 2. Since the wink is a valid one it terminates within interval T2 and LEDs OI1 and OI2 are again turned on causing timer 110 to charge. Since the charging time constant of timer 110 is finite, transistor 116 remains on until capacitor 111 is charged sufficiently to exceed the threshold level determined by Zener diode 114. Consequently, timer 120 continues to charge during this interval and LED OI3 remains on. Additionally, since the wink signal terminated prior to timer 120 timing out, LEDs OI4 and OI5 remain on as shown in waveform D of FIG. 2. Thus, LEDs OI2, OI3 and OI5 are all emitting light simultaneously, causing phototransistors OI2, OI3 and OI5, respectively, to conduct, thereby turning transistor 140 on and yielding a wink output signal, as indicated in waveform E of FIG. 2. Once the output from timer 110 exceeds the threshold to turn transistor 116 on, LED OI3 is turned off which, in turn, turns off phototransistor OI3 and, hence, transistor 140, yielding a wink pulse signal as shown in waveform E. The interval of the wink output from transistor 140 is approximately equal to the charging interval of timer 110. It is noted that there was no change in the operative states of LEDs OI4 and OI5, and, consequently, the wink pulse has effectively been filtered and not passed on to output terminals 131 and 132. The finite charge time of timing circuit 110 also affords noise immunity during the wink signal interval.

It is also noted that pulse inputs present for less than interval T1 are ignored by the present circuit, since timer 110 does not time out and transistor 116 remains on. The duration of interval T1 is selected to filter effectively noise and undesired signals from being passed on to terminals 131 and 132. In this example, interval T1 is selected to be approximately 50 ms while interval T2 is selected to be approximately 100 ms.

If a pulse input is present for a duration greater than interval T3 it is assumed that a change has occurred in the input condition and this change must be supplied to output terminals 131 and 132 for use as desired.

Operation of the present detector for pulse signals which exceed interval T3 is essentially the same as described above except that timer 120 times out, i.e., the potential developed across capacitor 124 exceeds the threshold needed to turn transistor 128 on. Thus, LEDs OI1 and OI2 are initially on and then turn off as shown in waveform F of FIG. 2. After timer 110 times out LED OI3 is turned on by the charging current of timer 120 as shown in waveform G of FIG. 2. Once timer 120 yields an output which exceeds the threshold needed to turn transistor 128 on, LEDs OI4 and OI5 are turned off as shown in waveform H of FIG. 2. Consequently, the change in the input condition is transmitted to terminals 131 and 132 via phototransistor OI4 to be utilized as desired. Additionally, it is noted that there is no wink output from transistor 140 since LEDs OI2, OI3 and OI5 were not simultaneously on during the signal interval. This is indicated by no change in the output from transistor 140 as shown in waveform I of FIG. 2.

Figure 3:
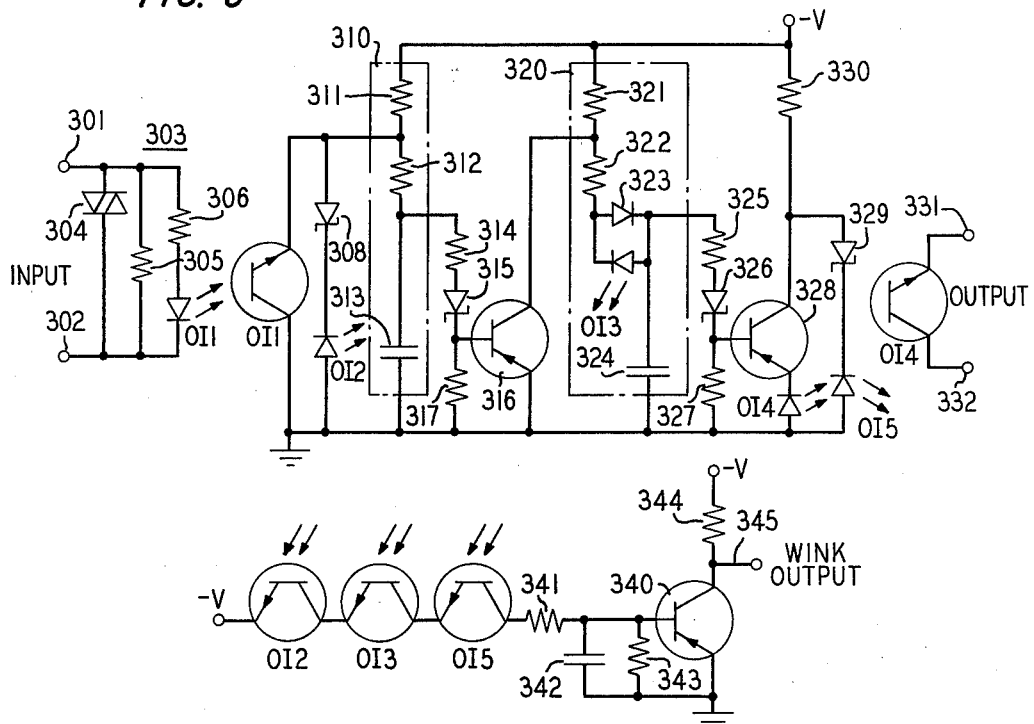
FIG. 3 shows a second embodiment of the invention employed to detect and/or filter so-called off-hook wink signals.

FIG. 3 shows details of another embodiment of a pulse detector and/or filter employing the instant invention. This embodiment is used to detect and filter off-hook wink signals. That is, a momentary change from an initial off condition to an on condition and, then, returning to an off condition on a telephone signaling lead. Such a signal may also be characterized as a pulse signal having a pulse width which is greater than first predetermined interval T1 and within a second predetermined interval T2 but less than a third predetermined interval T3 = T1 + T2.

Accordingly, signals are applied via input terminals 301 and 302 to input circuit 303. Input circuit 303 includes variolosser 304, resistor 305 and limiting resistor 306 connected in series with a radiant energy emitting element, for example, LED OI1. LED OI1 is employed to couple the applied input signal to the detector and/or filter of the present invention. The output from OI1 is supplied to an associated radiant energy responsive element, for example, phototransistor OI1. In turn, phototransistor OI1 is employed to control the operative states of first timing circuit 310, for example, enabled or disabled. When phototransistor OI1 is on, in response to light from LED OI1, the junction between resistors 311 and 312 is connected to a reference potential point, i.e., ground, and timer 310 is enabled to discharge. When phototransistor OI1 is off timing circuit 310 is disabled so that it will charge. Zener diode 308 connected in series with LED OI2 is employed to insure that LED OI2 is off when phototransistor OI1 is on. LED OI2 yields radiant energy, i.e., light, or not, representative of the input to the detector.

Timing circuit 310 includes resistor 311, resistor 312 and capacitor 313. The charging and discharging time constants of timing circuit 310 are determined primarily by the component values of resistors 311 and 312 and capacitor 313, as will be apparent to those skilled in the art. It is noted that the junction between resistors 311 and 312 during charging of timing circuit 310 is clamped to a potential determined by Zener diode 308 and LED OI2 which has some affect on the charging time constant. The affect of resistor 314, Zener diode 315, resistor 317 and the base-to-emitter junction of transistor 316 on the charging and discharging time constants is substantially negligible and may be ignored. Zener diode 315 is employed to establish a threshold potential for turning transistor 316 on and off. Consequently, when the potential developed across capacitor 313 exceeds this threshold transistor 316 is turned on, and when the potential developed across capacitor 313 drops below the threshold, transistor 316 is turned off.

It will be apparent to those skilled in the art how to select and adjust the component values of timing circuit 310 and desired threshold levels via selection of appropriate Zener diodes to obtain desired charging and discharging time constants. In an example from experimental practice, substantially identical charging and discharging times of approximately 10 ms are employed. Apparently, less noise immunity is needed when detecting off-hook wink signals.

Transistor 316 is employed to controllably enable and disable second timing circuit 320. Timing circuit 320 is employed to establish interval T2, i.e., the valid wink time window. It includes resistor 321, resistor 322, diode 323, LED OI3, and capacitor 324. Here again, the charging and discharging time constants are obtained in well-known fashion. When transistor 316 is off, timing circuit 320 is charging, and when transistor 316 is on, timing circuit 320 is discharging. The charging time constant is selected so that a threshold potential level determined by Zener diode 326 and the base-to-emitter junction of transistor 328 is exceeded in time interval T2. In one example, this interval is approximately 100 ms. Resistors 325, 327 and 330 are employed in well-known fashion for biasing purposes and the like. In turn, transistor 328 is employed to control the operative states of LEDs OI4 and OI5. When transistor 328 is on, LED OI4 is also on and LED OI5 is off. When transistor 328 is off, LED OI4 is off and LED OI5 is on. Zener diode 329 is employed to insure that LED OI5 is off when transistor 328 is on. Radiant energy emitted from LED OI4 is supplied to an associated radiant energy responsive element, for example, phototransistor OI4, which in turn is connected to output terminals 331 and 332.

Sensing LEDs OI2, OI3 and OI5 yield radiant energy, i.e., light, or not, representative of the input condition to the detector and/or filter, the operative condition of the second timing circuit, and the output state of the detector, respectively. The radiant energy, i.e., light, emitted from LEDs OI2, OI3 and OI5 are supplied to associated radiant energy responsive elements, namely phototransistors OI2, OI3 and OI5, respectively. Phototransistors OI2, OI3 and OI5 are serially connected with resistor 341 between potential source −V and the base terminal of transistor 340. Capacitor 342 is employed for noise immunity in well-known fashion while resistor 343 is employed for biasing. Similarly, resistor 344 is connected between potential source −V and the collector terminal of transistor 340. When transistor 340 is off potential −V appears at wink output 345. When transistor 340 is on substantially ground potential appears at wink output 345. It is noted that for transistor 340 to be on, phototransistors OI2, OI3 and OI5 must be conducting simultaneously and, consequently, LEDs OI2, OI3 and OI5 must be emitting light simultaneously.

Figure 4:
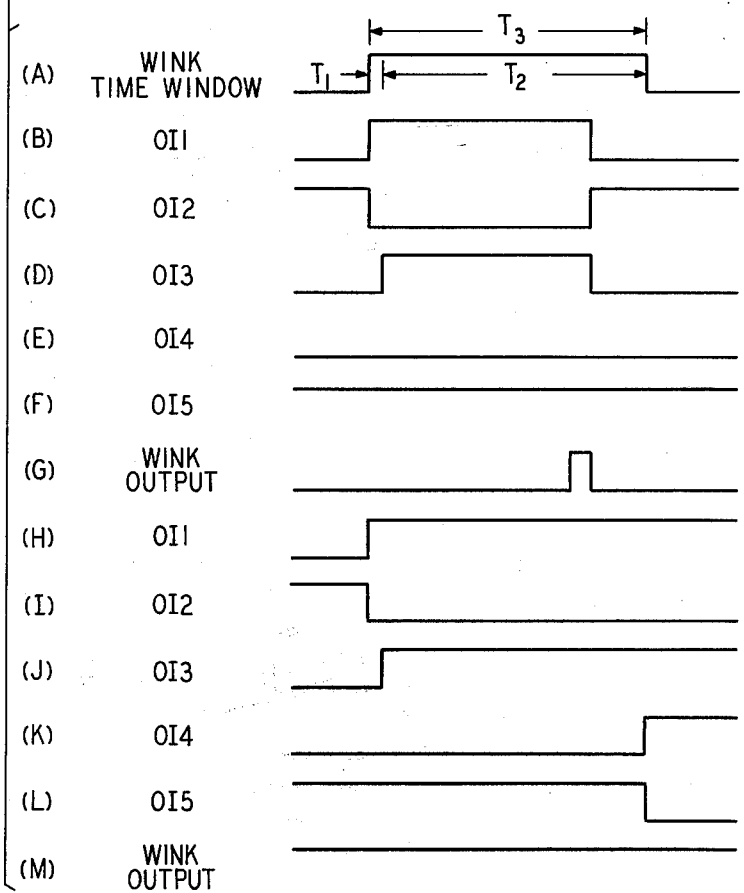
FIG. 4 shows a sequence of waveforms useful in describing the operation of the circuit of FIG. 3.

The circuit shown in FIG. 3 is best employed to detect and/or filter off-hook wink signals. Such a wink signal, or pulse signal, is defined in this example as being initially off, then on for an interval greater than first predetermined interval T1 but less than third predetermined interval T3. That is, a valid off-hook wink signal must fall within time interval T2, which is designated as the wink time window and is illustrated in waveform A of FIG. 4. The operative state of the input to the detector as indicated by LED OI1 is illustated in waveform B of FIG. 4 while the operative condition of the input to detector and filter circuit is also indicated by LED OI2 as shown in waveform C of FIG. 4. Thus, it is seen that LED OI2 is initially on, is turned off in response to the applied wink signal, and is again turned on at the termination of the applied wink or pulse signal. In response to LED OI1 being on, phototransistor OI1 is turned on which causes first timing circuit 310 to discharge in addition to turning LED OI2 off. Once first predetermined interval T1 has terminated transistor 316 is turned off, thereby enabling timing circuit 320 to charge and causing LED OI3 to emit light as shown in waveform D of FIG. 4. Since we have assumed that a valid wink or pulse signal is being applied to the detector, it is terminated prior to the end of interval T3. Consequently, LED OI1 is turned off causing phototransistor OI1 to be turned off and LED OI2 to be turned on. Since timing circuit 310 has a finite charge time, transistor 316 remains off for that interval, which in this example is approximately 10 ms. Since transistor 316 is off, timing circuit 320 continues to charge and LED OI3 continues to emit light. Since the interval T3 has not been exceeded, transistor 328 remains off as does LED OI4, while LED OI5 remains on, as indicated in waveforms E and F, respectively, of FIG. 4. Since LEDs OI2, OI3 and OI5 are on simultaneously, the associated phototransistors OI2, OI3 and OI5, respectively, are simultaneously on thereby turning transistor 340 on and a pulse signal is generated at wink output 345 as shown in waveform G of FIG. 4. Once timing circuit 310 has charged, transistor 316 is turned on and second timing circuit 320 is disabled, thereby turning LED OI3 off. As is seen from the waveforms B through G of FIG. 4, a valid off-hook wink signal has been detected but has not been supplied to output terminals 331 and 332 and has effectively been filtered.

It is also noted that pulse inputs present for less than interval T1 are ignored by the detector circuit since timing circuit 310 does not time out and transistor 316 remains on. As indicated above, the duration of interval T1 is selected to filter effectively noise and other undesired signals from being passed on to output terminals 331 and 332. In this example, interval T1 is selected to be approximately 10 ms while interval T2 is selected to be approximately 100 ms.

If a pulse signal input is present for a duration greater than interval T3 it is assumed that a change in the supervisory condition applied to input terminals 301 and 302 has occurred and this change must be, and is, supplied to output terminals 131 and 132 after termination of interval T3 for use as desired.

Operation of the detector circuit for pulse signals which exceed interval T3 is essentially the same as described above except that timing circuit 320 times out, i.e., the potential developed across capacitor 324 exceeds the threshold needed to turn transistor 328 on. Consequently, LED OI4 is enabled to emit light while LED OI5 is turned off. This condition is shown in waveforms H through M of FIG. 4. Since a valid change in the supervisory condition applied to terminals 301 and 302 has occurred, no wink signal output is generated, as indicated in waveform M of FIG. 4.

The above-described arrangements are, of course, merely illustrative of applications of the principles of the invention. Numerous other arrangements may be devised by those skilled in the art without departing from the spirit and scope of the invention. Although the disclosed embodiments of the invention have been explained in terms of detecting telephone signals, the invention may be equally employed in arrangements for detecting pulse signals in other systems and equipments.

What is claimed is:

1. A pulse signal detector which comprises:
   first timing means for yielding a first predetermined output only after being controllably enabled for a first predetermined interval in response to an applied input signal;
   first means for yielding a first representation indicative of an operative state of said first timing means;
   second timing means for yielding a second predetermined output only after being controllably enabled for a second predetermined interval in response to said first predetermined output;
   second means for yielding a second representation indicative of an operative state of said second timing means; and
   third means responsive to said first representation, said second representation and an output from said second timing means for yielding an indication when said applied signal has a width greater than said first predetermined interval and less than said first predetermined interval plus said second predetermined interval.

2. A detector as defined in claim 1 wherein said first means and said second means each include radiant energy emitting means.

3. A pulse signal detector which comprises:
   first timing means for yielding a first predetermined output after being enabled for a first predetermined interval in response to an applied input signal;
   first means for yielding a first representation indicative of an operative state of said first timing means;
   second timing means including output means for yielding a second predetermined output after being enabled for a second predetermined interval in response to said first predetermined output, said second timing means including output means for yielding a first output during intervals prior to said second timing means timing out and said second predetermined output after said second timing means has timed out, said second output being indicative of a change in the input condition to said detector;
   second means for yielding a second representation indicative of an operative state of said second timing means; and
   third means responsive to said first representation, said second representation and said second timing means outputs for yielding an indication when said applied signal has a width greater than said first predetermined interval and less than said first predetermined interval plus said second predetermined interval.

4. A detector as defined in claim 3 wherein said output means includes a light emitting diode and an associated phototransistor.

5. A pulse signal detector which comprises:
   first timing means for yielding a first predetermined output after being enabled for a first predetermined interval in response to an applied input signal;
   first radiant energy emitting means for yielding a first representation indicative of an operative state of said first timing means;
   second timing means for yielding a second predetermined output after being enabled for a second predetermined interval in response to said first predetermined output, said second timing means including output means for yielding a second representation indicative of the output state of said second timing means;
   second radiant energy emitting means for yielding a third representation indicative of an operative state of said second timing means; and
   third means responsive to said first, second and third representations for yielding an indication when said applied signal has a width greater than said first predetermined interval and less than said first predetermined interval plus said second predetermined interval.

6. A detector as defined in claim 5 wherein said second timing means output means includes third radiant energy emitting means.

7. A detector as defined in claim 6 wherein said third means further includes a plurality of radiant energy responsive means associated on a one-to-one basis with said first, second and third radiant energy emitting means.

8. A detector as defined in claim 7 wherein said first, second and third radiant energy emitting means each include unidirectional conducting means, said first unidirectional conductive means being poled so that said first radiant energy emitting means yields radiant energy when said first timing means is in a first operative state, said second unidirectional conductive means being poled so that said second radiant energy emitting means yields radiant energy when said second timing means is in a first operative state, and said third unidirectional conductive means being poled so that said third radiant energy emitting means yields radiant energy when the output of said second timing means is in a first state.

9. A detector as defined in claim 8 wherein said first, second and fourth radiant energy emitting means each include a light emitting diode and said associated radiant energy responsive means each include a phototransistor.

10. A detector circuit as defined in claim 9 wherein said phototransistors are serially connected for yielding an output only when said light emitting diodes are conducting simultaneously.

11. A pulse detector and filter which comprises:
   first timing means for yielding a first predetermined output only after being controllably enabled for a first predetermined interval in response to an applied input signal;
   second timing means for yielding a second predetermined output only after being controllably enabled in response to said first predetermined output for a second predetermined interval;
   first means for yielding a first representation of an operative state of said second timing means; and
   second means responsive to said applied signal, said first representation and said second timing means output for yielding an indication when said applied signal has a pulse width greater than said first predetermined interval and less than said first predetermined interval plus said second predetermined interval.

12. A pulse detector and filter as defined in claim 11 wherein said first means includes first radiant energy emitting means.

13. A pulse detector and filter which comprises:
   first timing means for yielding a first predetermined output after being enabled for a first predetermined interval in response to an applied input signal;

enabling means in circuit with said first timing means including a light emitting diode and an associated phototransistor, said light emitting diode being responsive to said applied input signal to emit radiant energy and said phototransistor being in circuit with said first timing means for controllably enabling said timing means to charge during intervals that said light emitting diode is emitting light and to discharge when said light emitting diode is not emitting light;

second timing means for yielding a second predetermined output after being enabled in response to said first predetermined output for a second predetermined interval;

first means for yielding a first representation of an operative state of said second timing means; and second means responsive to said applied signal, said first representation and said second timing means output for yielding an indication when said applied signal has a pulse width greater than said first predetermined interval and less than said first predetermined interval plus said second predetermined interval.

14. A detector and filter as defined in claim 13 wherein said second timing means further includes output means for yieldig a first output during intervals prior to said second timing means timing out and a second output during intervals after said second timing means has timed out.

15. A pulse detector and filter as defined in claim 14 wherein said output means includes a light emitting diode and an associated phototransistor.

16. A pulse detector and filter which comprises:

first timing means for yielding a first predetermined output after being enabled for a first predetermined interval in response to an applied input signal;

second timing means for yielding a second predetermined output after being enabled in response to said first predetermined output for a second predetermined interval;

first radiant energy emitting means for yielding a first representation of an operative state of said second timing means;

second means for yielding a second representation of an output stage of said second timing means;

third means responsive to said applied signal for yielding a third representation of the presence or absence of said applied signal; and fourth means responsive to said first second and third representations for yielding an output indication when said applied signal has a pulse width greater than said first predetermined interval and less than said first predetermined interval plus said second predetermined interval.

17. A pulse detector and filter as defined in claim 16 wherein said second and third means each include radiant energy emitting means and wherein said second means further includes a plurality of radiant energy responsive means associated on a one-to-one basis with said first, second and third means radiant energy emitting means and arranged to yield said indication when said radiant energy emitting means are emitting energy simultaneously.

18. A pulse detector and filter as defined in claim 17 wherein said first, second and third radiant energy emitting means are light emitting diodes and said associated radiant energy responsive means are phototransistors, said first light emitting diode being poled to emit light when said second timing means is in a charging state, said second light emitting diode being poled to yield light during intervals prior to said second timing means timing out, and said third light emitting diode being poled to emit light during intervals of an applied signal.

* * * * *